United States Patent
Otsuka et al.

(10) Patent No.: US 7,827,824 B2
(45) Date of Patent: Nov. 9, 2010

(54) SYNTHETIC QUARTZ GLASS SUBSTRATE FOR EXCIMER LASERS AND MAKING METHOD

(75) Inventors: Hisatoshi Otsuka, Joetsu (JP); Kazuo Shirota, Joetsu (JP); Osamu Sekizawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 307 days.

(21) Appl. No.: 11/896,948

(22) Filed: Sep. 6, 2007

(65) Prior Publication Data

US 2008/0119346 A1    May 22, 2008

(30) Foreign Application Priority Data

Sep. 7, 2006    (JP) .................... 2006-242535

(51) Int. Cl.
C03B 21/00 (2006.01)
C03B 23/00 (2006.01)
C03B 25/00 (2006.01)
C03B 27/00 (2006.01)
C03B 37/018 (2006.01)
C03B 31/00 (2006.01)
C03B 33/00 (2006.01)
C03C 3/06 (2006.01)

(52) U.S. Cl. ................ 65/104; 65/117; 65/414; 65/64; 501/54

(58) Field of Classification Search .......... 501/54; 65/104, 117, 414, 416, 64
See application file for complete search history.

(56) References Cited

U.S. PATENT DOCUMENTS

| | | | | |
|---|---|---|---|---|
| 5,330,941 | A | * | 7/1994 | Yaba et al. ................ 501/54 |
| 6,451,719 | B1 | | 9/2002 | Yamagata |
| 6,480,518 | B1 | * | 11/2002 | Fujinoki et al. ............ 372/57 |
| 6,499,317 | B1 | | 12/2002 | Ikuta et al. |
| 6,541,405 | B1 | | 4/2003 | Otsuka et al. |
| 2003/0027705 | A1 | | 2/2003 | Nishimura et al. |
| 2003/0051507 | A1 | * | 3/2003 | Ikuta et al. ................ 65/30.1 |
| 2003/0195107 | A1 | * | 10/2003 | Ikuta et al. ................ 501/57 |
| 2006/0137397 | A1 | | 6/2006 | Bookbinder et al. |
| 2006/0183622 | A1 | | 8/2006 | Nishimura et al. |
| 2007/0027018 | A1 | * | 2/2007 | Ogawa et al. ............. 501/53 |

FOREIGN PATENT DOCUMENTS

| DE | 10 2005 062 916 A1 | 7/2006 |
|---|---|---|
| EP | 1 061 052 A1 | 12/2000 |
| EP | 1 340 722 A1 | 9/2003 |
| JP | 1-212247 A | 8/1989 |
| JP | 7-43891 | 1/1995 |
| JP | 7-61823 A | 3/1995 |
| JP | 2762188 B2 | 3/1998 |

* cited by examiner

Primary Examiner—Karl E Group
Assistant Examiner—Noah S Wiese
(74) Attorney, Agent, or Firm—Birch Stewart Kolasch & Birch, LLP

(57) ABSTRACT

A synthetic quartz glass substrate having (i) an OH concentration of 1-100 ppm and a hydrogen molecule concentration of $1 \times 10^{16}$-$1 \times 10^{19}$ molecules/cm$^3$, (ii) an in-plane variation of its internal transmission at wavelength 193.4 nm which is up to 0.2%, and (iii) an internal transmission of at least 99.6% at wavelength 193.4 nm is suited for use with excimer lasers.

5 Claims, 1 Drawing Sheet

SYNTHETIC QUARTZ GLASS SUBSTRATE FOR EXCIMER LASERS AND MAKING METHOD

CROSS-REFERENCE TO RELATED APPLICATION

This non-provisional application claims priority under 35 U.S.C. §119(a) on Patent Application No. 2006-242535 filed in Japan on Sep. 7, 2006, the entire contents of which are hereby incorporated by reference.

TECHNICAL FIELD

The present invention relates to synthetic quartz glass substrates having a high transmission, transmission uniformity, a low birefringence, and a minimized change or uniform in-plane distribution of light transmission during use and adapted for use with excimer lasers, and particularly ArF excimer lasers, and even as synthetic quartz glass substrates for reticles or photomasks in the ArF immersion lithography or the like.

BACKGROUND ART

Higher levels of integration in VLSI circuits have led to exposure patterns of increasingly small linewidth. This has created a need for exposure light sources of shorter wavelength in the lithography systems or steppers used to write circuit patterns on semiconductor wafers. The i-line (wavelength, 365 nm), once the light source of choice in lithography steppers, has been largely supplanted by the KrF excimer laser (248 nm), and today ArF excimer lasers (193 nm) are starting to see industrial use. Also for providing higher NA, the introduction of the immersion lithography is under investigation.

In unison with the development of light sources with shorter wavelength and lenses with increased NA, there exists a need for higher precision not only in the optical components (e.g., lenses, windows, prisms) used in exposure tools, but also in the photomask-forming synthetic quartz glass substrates, known as reticles, serving as the IC circuit pattern master. With respect to the ArF excimer laser, in particular, many important problems remain unsolved including high UV light transmission and high transmission uniformity as is the case with optical components, as well as stability and uniformity of transmission to excimer laser radiation, and even a reduction of in-plane birefringence depending on the future exposure system, for example, use of polarized illumination.

Two processes are commonly used for making synthetic quartz glass ingots from which synthetic quartz glass substrates are made. In a direct process, a silica-forming raw material is flame hydrolyzed, forming fine particles of silica which are melted and deposited concurrently to effect growth. In a soot process, a silica-forming raw material is flame hydrolyzed, forming fine particles of silica which are deposited to effect growth, then later vitrified into clear glass.

In these processes, measures are usually taken to avoid incorporation of metal impurities which can cause ultraviolet absorption. In the direct process, for example, a vapor of a high purity silane or silicone compound, typically silicon tetrachloride is directly introduced into the oxyhydrogen flame. It is subjected to flame hydrolysis to form silica fine particles, which are deposited directly on a rotating heat resistant substrate of quartz glass or the like, where the material is melted and vitrified into transparent synthetic quartz glass.

The transparent synthetic quartz glass prepared in this way exhibits a good transmission even in the short wavelength region down to about 190 nm. It is thus used as transmissive material for ultraviolet laser radiation, specifically i-line, excimer laser beams such as KrF (248 nm), XeCl (308 nm), XeBr (282 nm), XeF (351 nm, 353 nm), and ArF (193 nm), and the 4-fold harmonic of YAG (250 nm).

The most important transmission to UV light is the transmission to the 193.4 nm wavelength light in the case of an ArF excimer laser. The transmission of quartz glass to light at this wavelength region decreases as the content of impurities rises. Typical impurities include alkali metals such as sodium, and other metallic elements such as copper and iron. If the silane or silicone starting material used to produce synthetic quart glass is of very high purity, the concentration of such metallic impurities present within the quartz glass can be brought down to below the level of detection by a high sensitivity detector (<1 ppb). However, because sodium and copper have relatively high coefficients of diffusion into synthetic quartz glass, such impurities of the external origin can often diffuse and admix in during heat treatment. Special care must be taken to avoid such contamination during these treatment operations.

Besides the impurities discussed above, intrinsic defects present in synthetic quartz glass are known to have impact on the transmission. The intrinsic defects are characterized by too much or too little oxygen for the Si—O—Si structure making up the synthetic quartz glass. Well-known examples include oxygen deficient defects (Si—Si, which absorbs at 245 nm) and oxygen surplus defects (Si—O—O—Si, which absorbs at 177 nm). However, such defects, or at least those which are measurable by spectrophotometry, are excluded from synthetic quartz glass for UV application to begin with. Of greater concern are more subtle defects, such as those of excessively stretched or compressed Si—O—Si bonds and those in which the Si—O—Si bond angle falls outside the stability range.

Such subtle defects are said to cause minute absorption in the UV region of wavelength 200 nm or shorter. It is believed that these defects result from some factors involved in the synthetic quartz glass manufacturing process. In the direct process described above, for example, a synthetic quartz glass ingot prepared thereby has a subtle difference in transmission between center and peripheral portions, as analyzed in a plane perpendicular to the growth direction, typically a difference of about 0.5% at the wavelength 193.4 nm of ArF excimer laser. This transmission difference is believed attributable to a temperature distribution in the silica growth/fusion face. It is believed that the peripheral portion assumes a subtle unstable structure due to a lower surface temperature at the peripheral portion than at the central portion and thus has a lower UV transmission.

To remove such unstable structures, JP-A 7-61823 discloses a method in which the growth rate of quartz glass produced by the direct process is held at or below a level of 2 mm per hour. Although this method does appear to work, its very slow growth rate leads to poor productivity and an economical problem.

As effective means for improving the UV transmission of synthetic quartz glass ingots, Japanese Patent No. 2762188 discloses that the absorption of light at wavelength 200 nm or shorter due to the contamination of synthetic quartz glass blocks during heat treatment is eliminated by irradiating UV radiation of wavelength in the range of 150 to 300 nm, desirably 180 to 255 nm.

Like the UV transmission, stability of synthetic quartz glass to excimer laser irradiation is also important. The stability is a very important factor particularly in the case of ArF excimer laser because the ArF excimer laser reportedly causes five times more damage than a KrF excimer laser.

When synthetic quartz glass is irradiated with ArF excimer laser light, there arises a phenomenon that Si—O—Si bonds undergo cleavage by the very intense energy of laser light, forming the paramagnetic defects commonly known as E' centers which absorb 215 nm light. This brings a loss of transmission at 193.4 nm to synthetic quartz glass. It is also known that another phenomenon, commonly referred to as "laser compaction," arises that a rearrangement of the network structure of quartz glass increases the glass density.

It is known that reducing the number of intrinsic defects in quartz glass and setting the hydrogen molecule concentration in quartz glass above a certain level are both highly effective for improving the stability of synthetic quartz glass to laser irradiation.

The fact that hydrogen molecules in the quartz glass inhibit damage to the glass by excimer laser irradiation is well-known in the art and has been the subject of active investigation ever since it was revealed in JP-A 1-212247.

With respect to hydrogen molecules, as disclosed in JP-A 7-43891, particularly in an accelerated irradiation test of operating ArF excimer laser at a high energy per pulse level of 100 mJ/cm$^2$, if more hydrogen molecules are present, the absorption at wavelength 193.4 nm increases at the initial irradiation stage, but mitigates during continued irradiation over a long term. Inversely, if less hydrogen molecules are present, the absorption at 193.4 nm is weak at the initial irradiation stage, but increases during continued irradiation over a long term. It is thus necessary to control as appropriate the concentration of hydrogen molecules in synthetic quartz glass.

While the direct process is designed in pursuit of productivity or intended for improved yields, some synthetic quartz glass ingots prepared thereby contain much more hydrogen molecules. This is due to the process conditions where the oxyhydrogen gas balance corresponds to an excess of hydrogen relative to the oxygen stoichiometry. These ingots are thus susceptible to increased initial absorption when irradiated with ArF excimer laser radiation.

There are two ways to include an appropriate level of hydrogen molecules in synthetic quartz glass. One method is by suitably adjusting the ratio of hydrogen, propane and oxygen used as the combustion-supporting gases during growth of a quartz glass ingot for thereby introducing hydrogen molecules into the growing ingot. This approach allows the concentration of hydrogen molecules in the synthetic quartz glass ingot to be adjusted within a range of about $1 \times 10^{17}$ to $2 \times 10^{19}$ molecules/cm$^3$.

The other method is by heat treating a synthetic quartz glass body within a hydrogen atmosphere, allowing for thermal diffusion of hydrogen molecules from the atmosphere into the glass body. This method has the advantage of possible strict control of the hydrogen molecule concentration. At the same time, it also has a number of significant disadvantages. Specifically, there is a need for a safety measure for avoiding the catastrophic explosion because it uses hydrogen gas. The heat treatment may allow impurities to diffuse into the quartz glass. These problems can be solved by the use of an ordinary safety measure, a high purity carbon material and the like.

The current concern about optical members used with the ArF excimer laser is a change of refractive index by changes of density and birefringence, known as compaction and rarefaction of glass, during laser irradiation at a practical level of energy and a practical number of shots. It is believed that these phenomena depend on the hydroxyl (OH) group concentration in glass. The solution for restraining or avoiding these phenomena is to reduce the OH concentration in glass. The OH concentration largely originates from the manufacture process of synthetic quartz glass. It is known that the manufacture by the soot process is easy to reduce the OH concentration. For this reason, the soot process is employed rather than the direct process.

Of the current most concern in the practical use of ArF excimer laser, for example, are the suppression of initial absorption and the uniformity of structural factors including birefringence upon laser irradiation within the surface of a synthetic quartz glass substrate.

DISCLOSURE OF THE INVENTION

An object of the present invention is to provide a synthetic quartz glass substrate having a high level and uniformity of UV transmission, the stability and uniformity of transmission upon excimer laser irradiation, and high optical homogeneity, and adapted for use with excimer lasers, and particularly as synthetic quartz glass substrates to form photomasks, also known as reticles, in the excimer laser lithography. Another object is to provide a method for preparing the same.

It has been found that when a synthetic quartz glass substrate is prepared by producing a synthetic quartz glass ingot by the vapor-phase axial deposition (VAD) version of the soot process, hot shaping it at a temperature of 1,700° C. to 1,900° C. into a block of desired shape, annealing the block at a temperature of 1,000° C. to 1,300° C., slicing the block into a synthetic quartz glass substrate with a predetermined thickness, and polishing the substrate, the quality of synthetic quartz glass substrate is improved by heat treating the substrate as sliced in a hydrogen atmosphere at or above atmospheric pressure and a temperature of 200° C. to 500° C. for a time. Specifically, the resulting synthetic quartz glass substrate satisfies the properties (i) to (iii) set forth below and is suited for use with the excimer laser, especially ArF excimer laser lithography, as a photomask-forming synthetic quartz glass substrate having an excellent transmission and subject to little deterioration.

Accordingly, the present invention provides a synthetic quartz glass substrate for use with excimer lasers and a method for preparing the same.

In one aspect, the invention provides a synthetic quartz glass substrate for use with excimer lasers, having (i) a hydroxyl group concentration of 1 to 100 ppm and a hydrogen molecule concentration of $1 \times 10^{16}$ to $1 \times 10^{19}$ molecules/cm$^3$, (ii) an in-plane variation of its internal transmission at wavelength 193.4 nm which is up to 0.2%, and (iii) an internal transmission of at least 99.6% at wavelength 193.4 nm. In a preferred embodiment, when ArF excimer laser radiation is irradiated into the surface of the substrate at an energy density per pulse of 10 mJ/cm$^2$ and a shot number of $2 \times 10^6$ pulses, the substrate experiences a change of transmission with a variation of up to 0.5%. In another preferred embodiment, the substrate has an in-plane birefringence maximum of up to 2 nm/cm.

In another aspect, the invention provides a method for preparing a synthetic quartz glass substrate for use with excimer lasers, comprising the steps of (1) hot shaping a synthetic quartz glass ingot produced by the VAD version of the soot process at a temperature in the range of 1,700° C. to 1,900° C. into a block of desired shape, (2) annealing the block at a temperature in the range of 1,000° C. to 1,300° C., (3) slicing the block into a synthetic quartz glass substrate with a predetermined thickness, and (4) heat treating the substrate in a hydrogen atmosphere at or above atmospheric pressure and a temperature in the range of 200° C. to 500° C. for a time. In a preferred embodiment, the substrate as sliced has a thickness of up to 20 mm. The time of heat treatment of the substrate is preferably in a range of 10 to 200 hours.

BENEFITS OF THE INVENTION

The synthetic quartz glass substrates of the present invention have a high transmission and a uniform in-plane distribution of transmission. They are subject to little deterioration or little density change by excimer laser irradiation. They are adapted for use with excimer lasers, particularly ArF excimer lasers, and even as synthetic quartz glass substrates to form photomasks, also known as reticles, in the ArF immersion lithography or the like.

DESCRIPTION OF THE PREFERRED EMBODIMENTS

Figure 1:
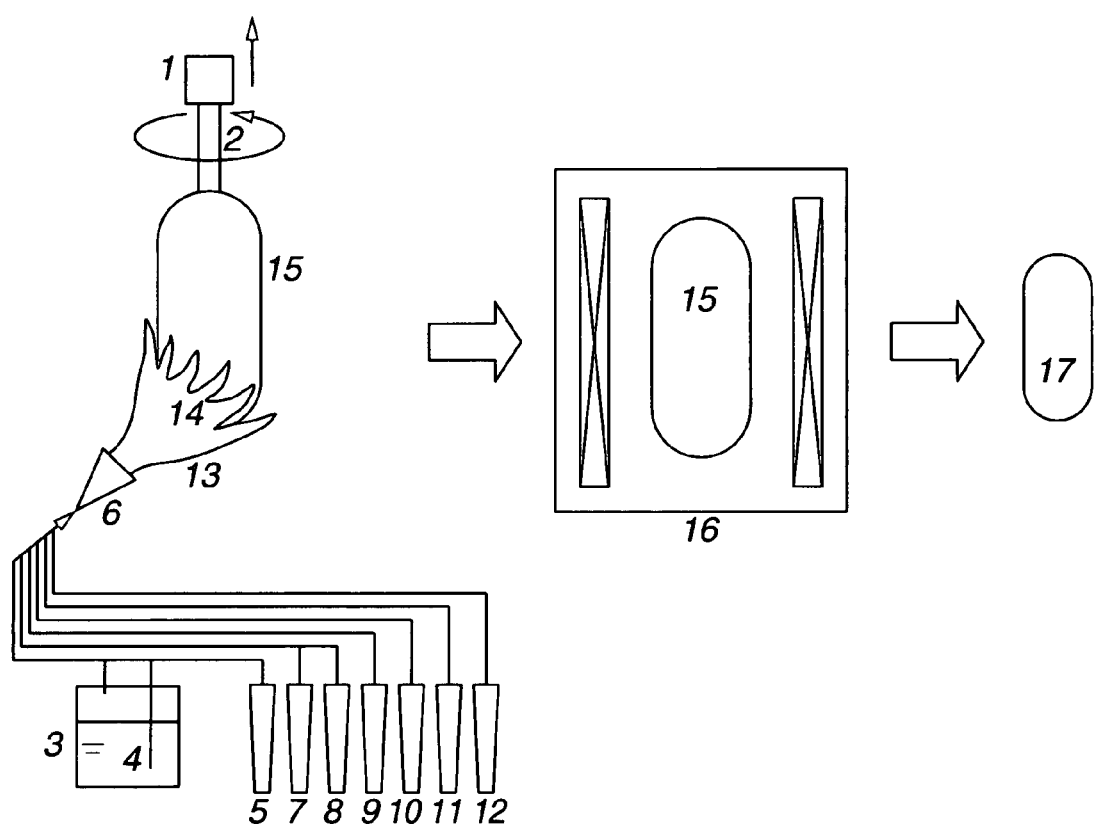
FIG. 1 is a schematic diagram showing an exemplary apparatus for producing synthetic quartz glass.

The synthetic quartz glass substrate of the invention satisfies the features including
(i) a hydroxyl (OH) group concentration of 1 to 100 ppm and a hydrogen molecule concentration of $1\times10^{16}$ to $1\times10^{19}$ molecules/cm$^3$,
(ii) an in-plane variation of its internal transmission at wavelength 193.4 nm which is up to 0.2%, and
(iii) an internal transmission of at least 99.6% at wavelength 193.4 nm.

Specifically, the synthetic quartz glass substrate of the invention for use with excimer lasers should have a hydrogen molecule concentration of $1\times10^{16}$ to $1\times10^{19}$ molecules/cubic centimeters, preferably $5\times10^{16}$ to $5\times10^{17}$ molecules/cm$^3$. A synthetic quartz glass substrate with a hydrogen molecule concentration of less than $1\times10^{16}$ molecules/cm$^3$ is effective in restraining the occurrence of initial absorption upon ArF excimer laser irradiation, but allows the absorption to increase during long-term irradiation. A hydrogen molecule concentration of more than $1\times10^{19}$ molecules/cm$^3$ is detrimental to productivity and cost.

The synthetic quartz glass substrate should have an in-plane variation of its internal transmission at wavelength 193.4 nm which is equal to or less than 0.2%, and preferably equal to or less than 0.1%. If a substrate having a substantial transmission distribution is used, for example, as a reticle in an optical stepper designed for a higher level of integration, trouble such as unevenness may be involved in the light exposure of the wafer. This is true particularly with an advanced ArF immersion stepper using polarized illumination. It is thus preferred that the substrate on its surface have a transmission distribution as uniform as possible.

Likewise, the synthetic quartz glass substrate should have an internal transmission of at least 99.6%, and preferably at least 99.7% at wavelength 193.4 nm. If a quartz glass substrate with a lower internal transmission is used as the reticle, for example, the substrate will absorb optical energy when it is transmitted by ArF excimer laser light, with the optical energy being converted into thermal energy to invite changes in the density of the synthetic quartz glass and even changes in refractive index. In an example where a synthetic quartz glass substrate with an internal transmission of less than 99% is used as the reticle in an exposure system using an ArF excimer laser as the light source, changes in the refractive index of the reticle will cause a failure like a distortion of the image plane.

In a preferred embodiment of the synthetic quartz glass substrate, when an ArF excimer laser is operated at an energy density per pulse of 10 mJ/cm$^2$ and a shot number of $2\times10^6$ pulses to emit radiation into the surface of the synthetic quartz glass substrate, the synthetic quartz glass substrate experiences a change of transmission with a variation of equal to or less than 0.5%, more preferably equal to or less than 0.3%, and even more preferably equal to or less than 0.2%. This variation of transmission change is determined by irradiating the synthetic quartz glass substrate with ArF excimer laser radiation at an energy density per pulse of 10 mJ/cm$^2$ and a shot number of $2\times10^6$ pulses, determining a change of light absorbance at wavelength 215 nm, and calculating a transmission change at wavelength 193.4 nm therefrom. The adjustment of the hydrogen molecule concentration in the synthetic quartz glass substrate within the above-specified range achieves stabilization against excimer laser irradiation, enabling to substantially restrain a transmission change.

In another preferred embodiment, the synthetic quartz glass substrate has an in-plane birefringence distribution which is higher in a peripheral portion than in a central portion and provides an in-plane birefringence having a maximum equal to or less than 2 nm/cm, especially equal to or less than 1 nm/cm.

While a synthetic quartz glass block which has been hot shaped is annealed to remove any thermal strain left therein and then cooled, the birefringence within the synthetic quartz glass substrate arises from a differential cooling rate between central and peripheral portions during the cooling step. Since the cooling rate is higher in the peripheral portion than in the central portion, the substrate has a distribution of birefringence that is higher in the peripheral portion.

The synthetic quartz glass substrate of the invention should have an OH content of 1 to 100 ppm, and preferably 10 to 50 ppm. If the OH content is less than 1 ppm, the vitrification of soot deposit into clear glass requires previous treatment with helium or similar gas for dehydration, which is undesired in view of operation and cost. If the OH content is more than 100 ppm, the substrate may lose resistance to excimer laser radiation. For restraining density change within the substrate and achieving uniformity of density within the substrate plane, the difference between maximum and minimum OH contents within the substrate plane should preferably be as small as possible, and specifically equal to or less than about 40 ppm.

The synthetic quartz glass substrate of the invention has a shape which may be selected as appropriate in accordance with its application. Most often the substrate has a rectangular plate shape. The dimensions of plates are not particularly limited although a plate of 6 inches square with a thickness of 6.35 mm is typical.

Next, the method of preparing a synthetic quartz glass substrate according to the invention is described.

Synthetic quartz glass ingots are first produced by supplying a silica-forming feedstock to an oxyhydrogen flame, subjecting it to vapor phase hydrolysis or oxidative decomposition in the flame to form fine particles of silica, depositing the silica particles on a target to form a sintered soot body, and heating the soot body in a high-temperature furnace for melting and vitrifying into the ingot. This process is generally called soot process, and specifically vapor-phase axial deposition (VAD) process.

The silica-forming feedstock used in this process comprises an organosilicon compound. Preferred examples include silane compounds of general formulae (1) and (2) and siloxane compounds of general formulae (3) and (4) below.

$$R_nSiX_{4-n} \quad (1)$$

Herein, R is hydrogen or an aliphatic monovalent hydrocarbon group, X is a halogen atom or alkoxy group, and n is an integer of 0 to 4.

$$(R^1)_nSi(OR^2)_{4-n} \quad (2)$$

Herein, $R^1$ and $R^2$ are each independently an aliphatic monovalent hydrocarbon group, and n is an integer of 0 to 3.

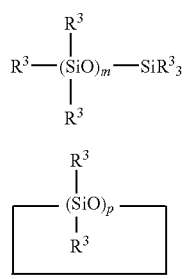

Herein, $R^3$ is hydrogen or an aliphatic monovalent hydrocarbon group, m is an integer of at least 1, especially equal to 1 or 2, and p is an integer of 3 to 5.

Illustrative examples of the aliphatic monovalent hydrocarbon groups represented by R, $R^1$, $R^2$ and $R^3$ include $C_{1-4}$ alkyl groups such as methyl, ethyl, propyl, n-butyl and tert-butyl; $C_{3-6}$ cycloalkyl groups such as cyclohexyl; and $C_{2-4}$ alkenyl groups such as vinyl and allyl.

Examples of suitable silane compounds of formulae (1) and (2) include $SiCl_4$, $CH_3SiCl_3$, $Si(OCH_3)_4$, $Si(OCH_2CH_3)_4$ and $CH_3Si(OCH_3)_3$. Examples of suitable siloxane compounds of formula (3) or (4) include hexamethyldisiloxane, hexamethylcyclotrisiloxane, octamethylcyclotetrasiloxane and decamethylcyclopentasiloxane.

A quartz burner that forms the oxyhydrogen flame is supplied with the silane or siloxane compound starting material, a combustible gas such as hydrogen, carbon monoxide, methane or propane, and a combustion-supporting gas such as oxygen.

As is usually the case, the burner which receives these feeds including silane compound, combustible gas (e.g., hydrogen), and combustion-supporting gas (e.g., oxygen) may be a multiple concentric tube burner, typically four- or six-tube burner. To produce a silica soot body having a density as uniform as possible, the burner should preferably be of multi-tube construction capable of forming a larger oxyhydrogen flame so that the silica soot depositing face is heated in its entirety. The apparatus used to produce the synthetic quartz soot body may have a vertical construction or a horizontal construction.

To reduce the OH content of glass uniformly, the silica soot body should preferably have a bulk density in the range of 0.3 to 0.7 g/cm³, and more preferably 0.4 to 0.6 g/cm³, the bulk density being an index for the sintered degree of the silica soot body.

It is noted that the OH content of glass largely depends on the treatment of silica soot body for vitrification. The vitrification treatment may use a heat treatment furnace selected from zone melting and vacuum melting furnaces which are commonly used for vitrification of optical fiber performs. In a preferred embodiment intended to reduce the OH content, the furnace is evacuated to a vacuum equal to or less than about 1 Pa, held at a temperature of 1,000° C. to 1,200° C. for at least 10 hours, specifically 10 to 30 hours, then raised to a temperature in the range of 1,300° C. to 1,600° C. over a time of at least 5 hours, specifically 5 to 20 hours, and held at the temperature for about 1 to 5 hours. Then a desired transparent synthetic quartz glass body is obtainable.

From the synthetic quartz glass ingot produced as described above, a synthetic quartz glass substrate is produced through the steps of (1) hot shaping the ingot at a temperature in the range of 1,700° C. to 1,900° C. into a block of desired shape, (2) annealing the block at a temperature in the range of 1,000° C. to 1,300° C., (3) slicing the block into a synthetic quartz glass substrate with a predetermined thickness, and (5) polishing the substrate as sliced. The method of the invention further includes the step (4) of heat treating the substrate as sliced in a hydrogen atmosphere at or above atmospheric pressure and a temperature in the range of 200° C. to 500° C. for a time, whereby the desired synthetic quartz glass substrate is produced.

Specifically, the synthetic quartz glass ingot prepared as above is worked on a cylindrical grinder or the like for removing impurities deposited thereon and sub-surface bubbles, immersed in aqueous hydrofluoric acid for etching away contaminants on the surface, then thoroughly washed with deionized water, and dried in a clean booth. Then hot shaping is carried out to form a block of desired shape. Most often, the synthetic quartz glass ingot is placed in a mold of high purity carbon material or the like in a vacuum melting furnace where the ingot is held in an inert gas atmosphere such as argon, at a slightly subatmospheric pressure and a temperature in the range of 1,700° C. to 1,900° C. for 30 to 120 minutes. In this way, the cylindrical ingot is converted into a prism-shaped synthetic quartz glass block.

For removing the thermal stress strain introduced by this hot shaping, the block is then annealed. Specifically, in an atmospheric pressure furnace, the block is held in air or in an inert gas atmosphere such as nitrogen at a temperature in the range of 1,000° C. to 1,300° C. for at least 5 hours and then slowly cooled over several hours or more, specifically about 10 to about 200 hours, to approximately the strain point temperature. The annealing is effective for suppressing the birefringence within the synthetic quartz glass block to 20 nm/cm or less. The birefringence can be reduced to a level of 2 nm/cm or less, for example, by adjusting the maximum temperature, the cooling rate until the strain point is reached, and the temperature at which the power supply is turned off.

The synthetic quartz glass block as annealed is ground on every surface by a surface grinding machine and finished such that opposed surfaces of each pair are parallel. The block is then sliced into a substrate and chamfered along each side.

In slicing the synthetic quartz glass block into a substrate, the substrate should preferably have a thickness equal to or less than 20 mm. It is not particularly necessary to set a lower limit to the substrate thickness although the thickness is usually at least 2 mm. If the thickness of the sliced substrate is more than 20 mm, it may take some time to dope the substrate with hydrogen molecules. For example, the current predominant synthetic quartz glass substrates used as the IC photomask typically have a thickness of 6.35 mm for the 6-inch square size. The original synthetic quartz glass block from which synthetic quartz glass substrates of this size are sliced generally has a thickness of at least 100 mm. If the hydrogen molecule concentration were adjusted in the synthetic quartz glass block as hot-shaped, holding in a hydrogen atmosphere at or above atmospheric pressure and at a temperature of 500°

C. for at least 0.5 month would be still insufficient to reach a hydrogen molecule concentration within the desired range, becoming a substantial disadvantage from the standpoint of productivity. This is because the diffusion and migration of hydrogen molecules is governed by the dimensions of a synthetic quartz glass block.

The hydrogen treatment of the synthetic quartz substrate as sliced is generally carried out in a furnace lined with purified heat insulating material by placing therein a stack of sliced substrates each having a thickness of up to 20 mm, setting the furnace atmosphere temperature in a range of 200° C. to 500° C., preferably 300° C. to 400° C., purging the furnace with nitrogen, setting the furnace at a hydrogen concentration of 20 to 100%, an internal pressure equal to or more than atmospheric pressure, specifically 0.2 to 0.9 MPa, and holding the substrates under these conditions for 10 to 200 hours, thereby introducing hydrogen in molecule form into the substrates. These parameters may be selected in accordance with the desired hydrogen molecule concentration to be established within the substrate.

Understandably, treatment temperatures below 200° C. lead to a lower rate of diffusion of hydrogen into quartz glass. Then a longer treatment time is necessary until a desired hydrogen molecule concentration is reached. This is disadvantageous from the standpoint of productivity. Treatment temperatures above 500° C. give rise to problems including an increased initial absorption upon ArF excimer laser irradiation and an increased birefringence of a sliced substrate. The use of an ordinary high-temperature furnace has a risk of impurities diffusing from the furnace material into the glass.

Particularly when it is desired to have synthetic quartz glass substrates having a maximum of birefringence equal to or less than 1 nm/cm, the synthetic quartz glass block is placed in a cylindrical quartz tube which has been treated and cleansed in the annealing atmospheric pressure furnace, the cylindrical quartz tube at the top and bottom is closed with synthetic quartz lids, and the block is held at a temperature in the range of 1,100 to 1,300° C. for a time of 5 to 24 hours, preferably 5 to 12 hours, and then cooled at a rate of 1 to 35° C./hr to a temperature of 200 to 600° C.

The sliced substrates after hydriding treatment are then subjected to a conventional finishing process including lapping, pre-polishing and final polishing, whereupon the target synthetic quartz glass substrates for use with excimer laser are obtained.

The synthetic quartz glass substrates thus completed are useful, for example, as synthetic quartz glass substrates to form photomasks, known as reticles, used during IC substrate fabrication in steppers.

EXAMPLE

Examples of the invention are given below by way of illustration and not by way of limitation.

In the Examples, measurements of the internal transmission, birefringence, and hydrogen molecule concentration were carried out as follows.

Internal Transmission:

Measured by ultraviolet spectrophotometry using a transmission spectrophotometer Cary 400 by VARIAN Inc.

Birefringence:

Measured using a birefringence measurement system, such as ABR-10A by Uniopt Corporation.

Hydrogen Molecule Concentration:

Measured by laser Raman spectrophotometry as described in *Zhurnal Priklandnoi Spektroskopil*, Vol. 46, No. 6, 987-991 (1987). Measurement was carried out by photon counting using a spectrometer NRS-2100 by JASCO Corp. In measurement of the hydrogen molecule concentration by argon laser Raman spectrophotometry, the measured values may vary with the sensitivity curve of the detector. Values must thus be calibrated using a reference sample.

Examples and Comparative Examples

A synthetic quartz glass ingot was produced by feeding 3,000 g/hr of methyltrichlorosilane to a quartz burner that formed a flame from 10 $Nm^3$/hr of oxygen and 8 $Nm^3$/hr of hydrogen, subjecting the silane to oxidative or combustive decomposition to form fine particles of silica, and depositing the silica particles on a rotating quartz target to form a soot deposit. In an electric melting furnace, the soot deposit was heated and vitrified into a transparent glass.

Referring to FIG. 1, a quartz glass target 2 was mounted on a rotating support 1. Argon gas 5 was introduced into the silica feedstock 4 (or methyltrichlorosilane) in a vaporizer 3. Methyltrichlorosilane vapor was carried out of the vaporizer by the argon 5, which was then fed to the center nozzle of a quartz burner 6. The burner 6 was also fed the following gases, in outward order from the silane-laden gas at the center: a mixture of oxygen 7 and inert gas 8 (e.g., nitrogen), hydrogen 9, oxygen 10, hydrogen 11, and oxygen 12. The burner 6 ejects the silica feedstock 4 (or methyltrichlorosilane) and an oxyhydrogen flame 13 toward the target 2. Fine particles of silica 14 were deposited on the target 2 until a soot body 15 having a diameter of 250 mm and a length of 1,000 mm was obtained.

During the soot deposition, the feedstock (or methyltrichlorosilane) was fed at a constant hourly flow rate, and the burner settings and the balance of oxygen/hydrogen gas flow rates through burner nozzles were adjusted so as to maintain the shape of the silica depositing/growing face unchanged.

The silica soot body 15 was then placed in an electric furnace 16 where it was heat treated in vacuum or in an atmosphere of argon or another inert gas at a temperature in the range of 1,000° C. to 1,600° C., yielding a clear synthetic quartz glass ingot 17 having a diameter of 150 mm and a length of 600 mm.

The surface of this synthetic quartz glass ingot was ground by a cylindrical grinding machine. For surface cleaning, the ingot was then dipped in 50 wt % hydrofluoric acid solution for 5 hours, washed with deionized water, and dried in a clean booth.

The synthetic quartz glass ingot as surface cleaned was placed in a carbon mold of desired shape in a vacuum melting furnace where it was heated in an argon atmosphere at a temperature of 1,780° C. for 40 minutes, hot shaping into a synthetic quartz glass block. The block was annealed by holding at a temperature of 1,200° C. for 2 hours and cooling down to 1,000° C. at a rate of 2° C./hr. At this point, the prism-shaped block had dimensions of 160 mm×160 mm×200 mm long. The block also had a hydrogen molecule concentration of up to $1\times10^{16}$ molecules/$cm^3$.

After surface conditioning as by grinding, the synthetic quartz glass block was sliced into substrates having a thickness of about 7 mm, which were chamfered. Twenty five (25) synthetic quartz glass substrates as sliced were stacked and placed in a cylindrical quartz tube having an inner diameter of 240 mm which had been treated for purification, in an atmospheric furnace. The quartz tube at the top and bottom was closed with synthetic quartz lids. The synthetic quartz glass substrates were treated under the conditions shown in Table 1 so that they were doped with hydrogen molecules.

Thereafter, the synthetic quartz glass substrates were lapped and polished in an ordinary way, yielding synthetic quartz glass substrates of the typical size, 6 inch square by a thickness of 6.35 mm.

A sample of 10 mm×6.35 mm×90 mm was cut out of the synthetic quartz glass substrate. Four surfaces (two 10×90 mm surfaces and two 6.35×90 mm surfaces) of the sample were polished. The sample was measured for a hydrogen molecule concentration and an absorbance at wavelength 215 nm through ArF excimer laser irradiation by known techniques. Another sample of 30 mm square was cut out of the substrate, and measured for a transmission of light with wavelength 193.4 nm between the 30 mm square surfaces. At the same time, a transmission distribution in the substrate plane was measured. The hydriding treatment conditions and ArF excimer laser performance are shown in Table 1.

TABLE 1

| | | Synthetic quartz glass substrate of 6 inch square | | | | | | | | | | | |
|---|---|---|---|---|---|---|---|---|---|---|---|---|---|
| | | Synthetic quartz glass substrate as sliced | | | | | Hydrogen concentration | | Internal transmission and in-plane variation | | | Transmission change* and in-plane variation | | | Maximum birefringence (nm/cm) |
| | | | Hydriding treatment | | | | | | | Sub- | | | Sub- | | |
| | | Thickness (mm) | Temperature (° C.) | Holding time (hr) | H² concentration (vol %) | Pressure (MPa) | (×10¹⁷ molecules/cm³) | OH concentration (ppm) | Substrate center (%) | strate periphery (%) | Difference (%) | Substrate center (%) | strate periphery (%) | Difference (%) | |
| Example | 1 | 7 | 400 | 100 | 20 | 0.2 | 2 | 30 | 99.8 | 99.7 | 0.01 | 0.2 | 0.1 | 0.1 | 0.76 |
| | 2 | 7 | 200 | 100 | 20 | 0.2 | 0.5 | 25 | 99.8 | 99.8 | 0.00 | 0.3 | 0.2 | 0.1 | 0.45 |
| | 3 | 7 | 500 | 100 | 20 | 0.2 | 3.5 | 55 | 99.8 | 99.8 | 0.00 | 0.05 | 0.08 | −0.03 | 0.33 |
| | 4 | 7 | 400 | 100 | 100 | 0.2 | 20 | 18 | 99.8 | 99.8 | 0.00 | 0.02 | 0.01 | 0.01 | 0.85 |
| Comparative Example | 1 | 50 | 400 | 100 | 20 | 0.2 | 0.05 | 30 | 99.8 | 99.7 | 0.01 | 0.4 | 0.15 | 0.25 | 0.75 |
| | 2 | 7 | 700 | 100 | 20 | 0.2 | 60 | 30 | 99.8 | 99.7 | 0.01 | 1.2 | 0.5 | 0.7 | 2.5 |

*ArF excimer laser irradiation conditions:
energy density per pulse = 10 mJ/cm²
shot number = 2 × 10⁶ pulses Japanese Patent Application No. 2006-242535 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a synthetic quartz glass substrate for use with excimer lasers, comprising the steps of:
   (1) holding a synthetic quartz glass ingot, which is produced by a VAD soot process, at a temperature of 1,000° C. to 1,200° C. for at least 10 hours, raising the temperature in the range of 1,300° C. to 1600° C. over a time of at least 5 hours, and holding the ingot at the temperature for 1 to 5 hours;
   (2) hot shaping the ingot at a temperature in the range of 1,700° C. to 1,900° C. into a block of desired shape;
   (3) annealing the block at a temperature in the range of 1,000° C. to 1,300° C.;
   (4) slicing the block into a synthetic quartz glass substrate with a predetermined thickness; and
   (5) heat treating the substrate in a hydrogen atmosphere at or above atmospheric pressure and a temperature in the range of 200° C. to 500° C. for a time.

2. The method of claim 1 wherein the substrate as sliced has a thickness of up to 20 mm.

3. The method of claim 1 wherein the time of heat treatment of the substrate is in a range of 10 to 200 hours.

4. The method of claim 1, wherein the step (1) is conducted at pressure of 1 Pa or lower.

5. A method for preparing a synthetic quartz glass substrate for use with excimer lasers, comprising the steps of:
   (1) holding a synthetic quartz glass ingot, which is produced by a VAD soot process, at a temperature of 1,000° C. to 1,200° C. for at least 10 hours, raising the temperature in the range of 1,300° C. to 1,600° C. over a time of at least 5 hours, and holding the ingot at the temperature for 1 to 5 hours;
   (2) hot shaping the ingot at a temperature in the range of 1,700° C. to 1,900° C. into a block of desired shape;
   (3) annealing the block at a temperature in the range of 1,000° C. to 1,300° C.;
   (4) slicing the block into a synthetic quartz glass substrate with a predetermined thickness; and
   (5) heat treating the substrate in a hydrogen atmosphere at or above atmospheric pressure and a temperature in the range of 200° C. to 500° C. for a time,
   so as to obtain the synthetic quartz glass substrate having:
   (i) a hydroxyl group concentration of 1 to 100 ppm and a hydrogen molecule concentration of $1 \times 10^{16}$ to $1 \times 10^{19}$ molecules/cm³;
   (ii) an in-plane variation of its internal transmission at wavelength 193.4 nm which is up to 0.2%; and
   (iii) an internal transmission of at least 99.6% at wavelength 193.4 nm.

* * * * *